(12) United States Patent
Rabkin et al.

(10) Patent No.: US 8,462,580 B2
(45) Date of Patent: Jun. 11, 2013

(54) MEMORY SYSTEM WITH REVERSIBLE RESISTIVITY-SWITCHING USING PULSES OF ALTERNATRIE POLARITY

(75) Inventors: Peter Rabkin, Cupertino, CA (US); George Samachisa, San Jose, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 254 days.

(21) Appl. No.: 12/948,375

(22) Filed: Nov. 17, 2010

(65) Prior Publication Data

US 2012/0120710 A1    May 17, 2012

(51) Int. Cl.
| | |
|---|---|
| *G11C 7/12* | (2006.01) |
| *G11C 8/08* | (2006.01) |
| *G11C 7/22* | (2006.01) |
| *G11C 11/36* | (2006.01) |
| *G11C 11/34* | (2006.01) |

(52) U.S. Cl.
USPC ...... 365/243; 365/242; 365/189.16; 365/148; 365/158; 365/163

(58) Field of Classification Search
USPC ............ 365/148, 158, 163, 171, 173, 189.16, 365/242, 243
See application file for complete search history.

(56) References Cited

U.S. PATENT DOCUMENTS

| | | | |
|---|---|---|---|
| 5,825,046 A | 10/1998 | Czubatyj | |
| 7,324,366 B2 | 1/2008 | Bednorz | |
| 7,885,091 B2 | 2/2011 | Mihnea | |
| 8,107,283 B2 | 1/2012 | Chen | |
| 8,154,904 B2 | 4/2012 | Sekar | |
| 2006/0160307 A1* | 7/2006 | Joo et al. | 438/261 |
| 2006/0203542 A1* | 9/2006 | Kurotsuchi et al. | 365/163 |
| 2007/0153570 A1* | 7/2007 | Suh | 365/163 |
| 2008/0185574 A1 | 8/2008 | Campbell | |
| 2009/0001343 A1 | 1/2009 | Schricker | |
| 2009/0003035 A1* | 1/2009 | Philipp et al. | 365/148 |
| 2009/0046495 A1 | 2/2009 | Shimaoka | |

(Continued)

FOREIGN PATENT DOCUMENTS

| | | |
|---|---|---|
| WO | WO 2005124787 A2 * | 12/2005 |
| WO | WO2009142828 | 11/2009 |
| WO | WO2009150608 | 12/2009 |

OTHER PUBLICATIONS

PCT International Search Report dated Dec. 19, 2011, PCT Patent Application No. PCT/US2011/056126.

(Continued)

*Primary Examiner* — J. H. Hur
(74) *Attorney, Agent, or Firm* — Vierra Magen Marcus LLP

(57) ABSTRACT

A memory system includes a plurality of non-volatile storage elements that each comprise a diode (or other steering device) in series with reversible resistance-switching material. One or more circuits in the memory system program the non-volatile storage elements by changing the reversible resistance-switching material of one or more non-volatile storage elements to a first resistance state. The memory system can also change the reversible resistance-switching material of one or more of the non-volatile storage elements from the first resistance state to a second resistance state by applying one or more pairs of opposite polarity voltage conditions (e.g., pulses) to the respective diodes (or other steering devices) such that current flows in the diodes (or other steering devices) without operating the diodes (or other steering devices) in breakdown condition.

30 Claims, 11 Drawing Sheets

U.S. PATENT DOCUMENTS

| | | | |
|---|---|---|---|
| 2009/0296449 A1* | 12/2009 | Slesazeck et al. | 365/148 |
| 2009/0308313 A1 | 12/2009 | Allenspach | |
| 2009/0323391 A1 | 12/2009 | Scheuerlein | |
| 2010/0014343 A1* | 1/2010 | Wei et al. | 365/148 |
| 2010/0177559 A1 | 7/2010 | Chen | |
| 2011/0007547 A1* | 1/2011 | Khoury et al. | 365/148 |
| 2012/0120711 A1* | 5/2012 | Rabkin et al. | 365/148 |

OTHER PUBLICATIONS

PCT Written Opinion of the International Searching Authority dated Dec. 19, 2011, PCT Patent Application No. PCT/US2011/056126.

Sawa, "Resistive switching in transition metal oxides," Materials Today, pp. 28-36, Jun. 2008, vol. 11, No. 6.

U.S. Appl. No. 12/948,388, filed Nov. 17, 2010.

U.S. Appl. No. 12/642,191, filed Dec. 18, 2009.

Filing Receipt dated Jan. 11, 2010, U.S. Appl. No. 12/642,191, filed Dec. 18, 2009.

PCT International Search Report dated Jan. 31, 2012, PCT Patent Application No. PCT/US2011/056130.

PCT Written Opinion of the International Searching Authority dated Jan. 31, 2012, PCT Patent Application No. PCT/US2011/056130.

Notice of Allowance dated Oct. 11, 2012, U.S. Appl. No. 12/948,388.

\* cited by examiner

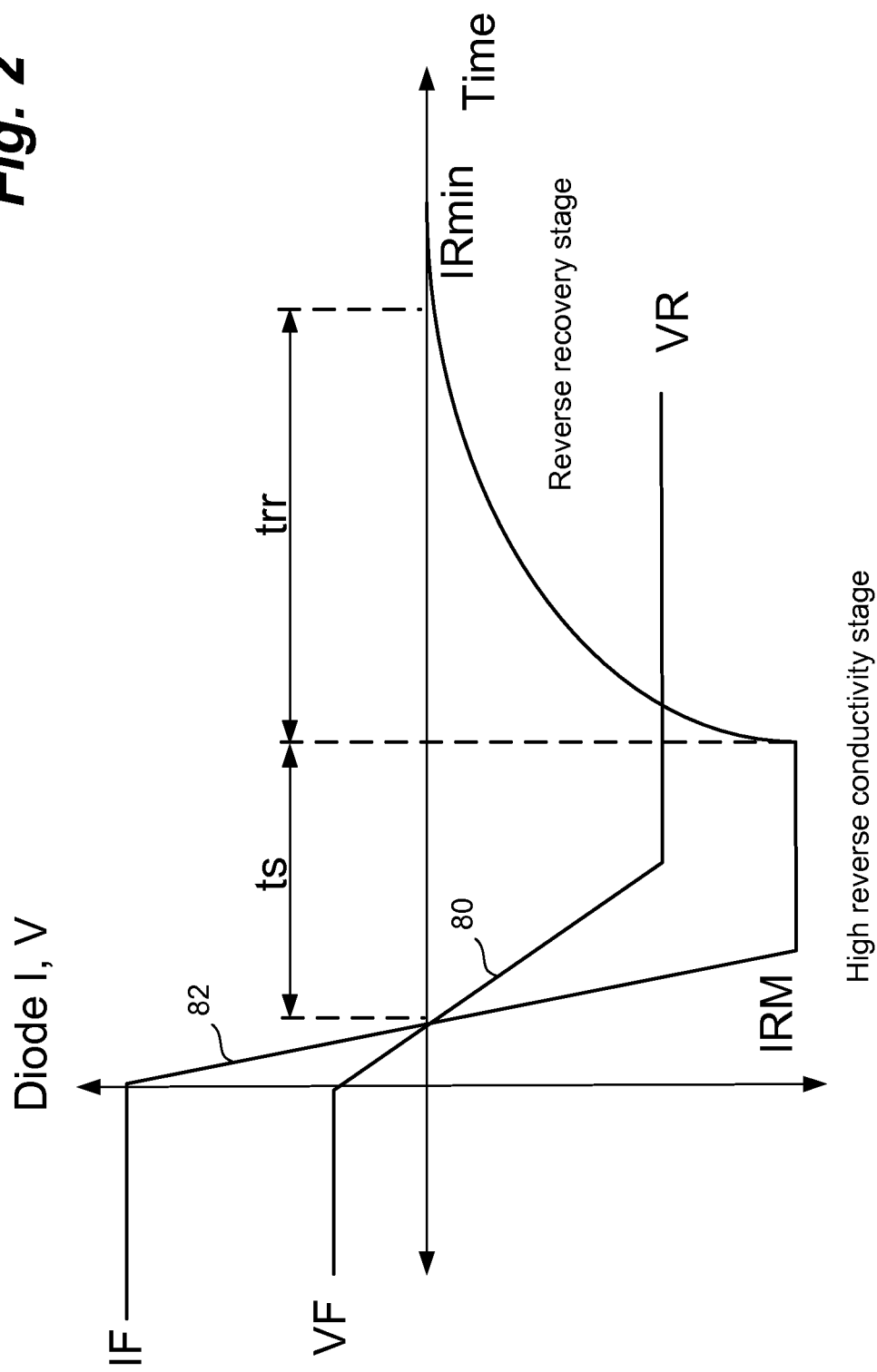

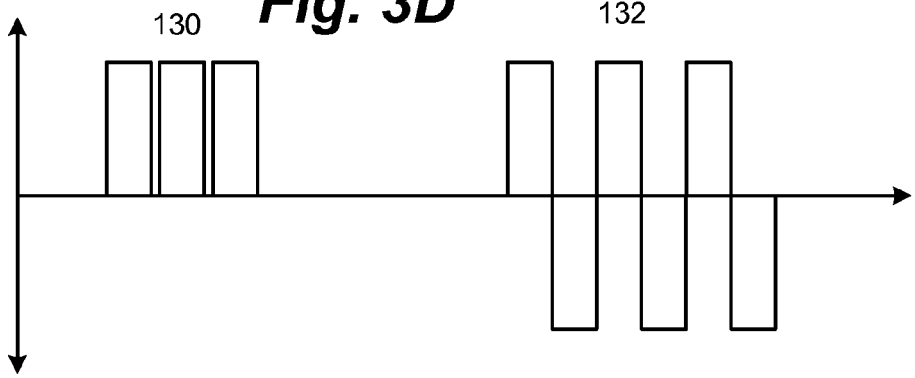
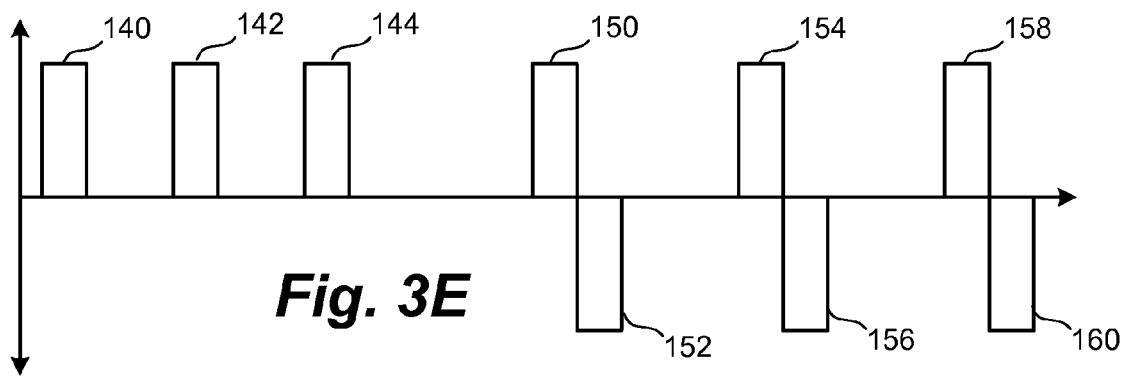
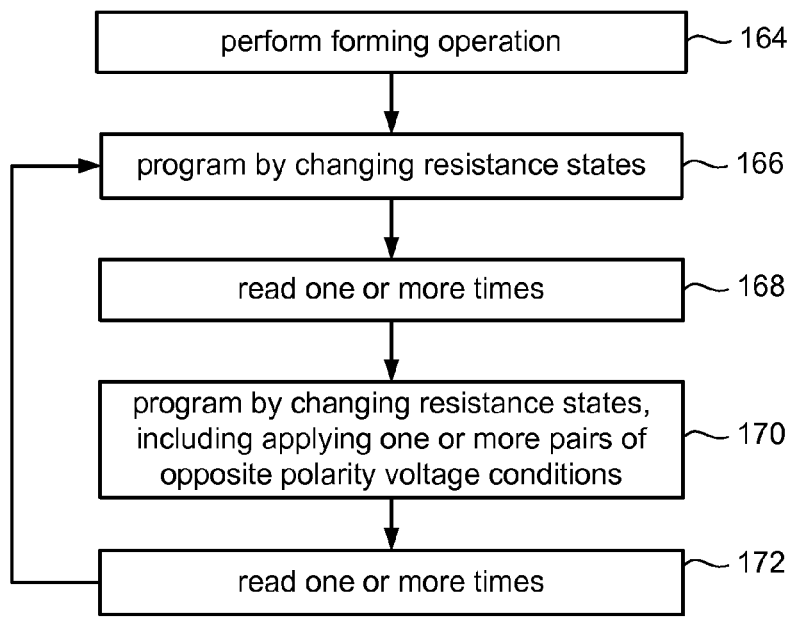

MEMORY SYSTEM WITH REVERSIBLE RESISTIVITY-SWITCHING USING PULSES OF ALTERNATRIE POLARITY

BACKGROUND

1. Field

This application relates to technology for non-volatile storage.

2. Description of the Related Art

A variety of materials show reversible resistance-switching behavior, and as such may be suitable for use with memory systems. For example, transition metal oxides have been proposed for reversible resistance-switching memories. Upon application of sufficient voltage, current, or other stimulus, the reversible resistance-switching material switches to a stable low-resistance state, which is sometimes referred to as SETTING the device or performing a SET operation. This resistance-switching is reversible such that subsequent application of an appropriate voltage, current, or other stimulus can serve to return the reversible resistance-switching material to a stable high-resistance state, which is sometimes referred to as RESETTING the device or performing a RESET operation. This conversion can be repeated many times. The low resistance state is sometimes referred to as an "on" state. The high resistance state is sometimes referred to as an "off" state. For some reversible resistance-switching materials, the initial state is low-resistance rather than high-resistance. For purposes of the following discussion, any of the operations of RESETTING and SETTING may be considered to be a programming operation. In some devices, prior to being able to perform SET operations and RESET operations, a devices must be initialized by applying a voltage potential across the reversible resistance-switching material in an operation referred to as FORMING.

These reversible resistance-switching materials are of interest for use in nonvolatile memory systems. One type of memory system is referred to as a cross-point array, which is a matrix of memory elements typically arranged along x-axes (e.g., word lines) and along y-axes (e.g., bit lines). A digital value may be stored as a memory resistance (high or low). The state of a memory cell can be read by supplying appropriate voltages to the bit line and word line connected to the selected memory cell. The state of the memory cell can be read as an output voltage of the bit line connected to the selected memory cell. One resistance state may correspond to a data "0," for example, while the other resistance state corresponds to a data "1." Some switching materials may have more than two stable resistance states.

Operating memory devices that employ reversible resistance-switching materials is challenging.

BRIEF DESCRIPTION OF THE DRAWINGS

FIG. 2 is a graph depicting voltage and current characteristics for a diode.

FIG. 3A-E depict voltage pulses used to program memory cells.

FIG. 4 is a flow chart describing one embodiment of a process for operating a memory system.

DETAILED DESCRIPTION

A memory system is disclosed that includes a plurality of memory cells. In one embodiment, each memory cell comprises a steering device in series with reversible resistance-switching material; however, other structures can also be utilized. The memory cells are programmed by performing SET and/or RESET operations. Depending on the materials used for the steering device and the reversible resistance-switching material, one of the SET and RESET operations is performed by applying a first voltage to the memory cells wherein the steering device (e.g., diode) is forward biased. The other of the SET and RESET operations can be performed by applying one or more pairs of opposite polarity voltage conditions to the memory cells. One example of opposite polarity voltage conditions includes a first voltage pulse that forward biases the steering element and a second voltage pulse that reverse biases the steering device.

Memory Cell

Figure 1:
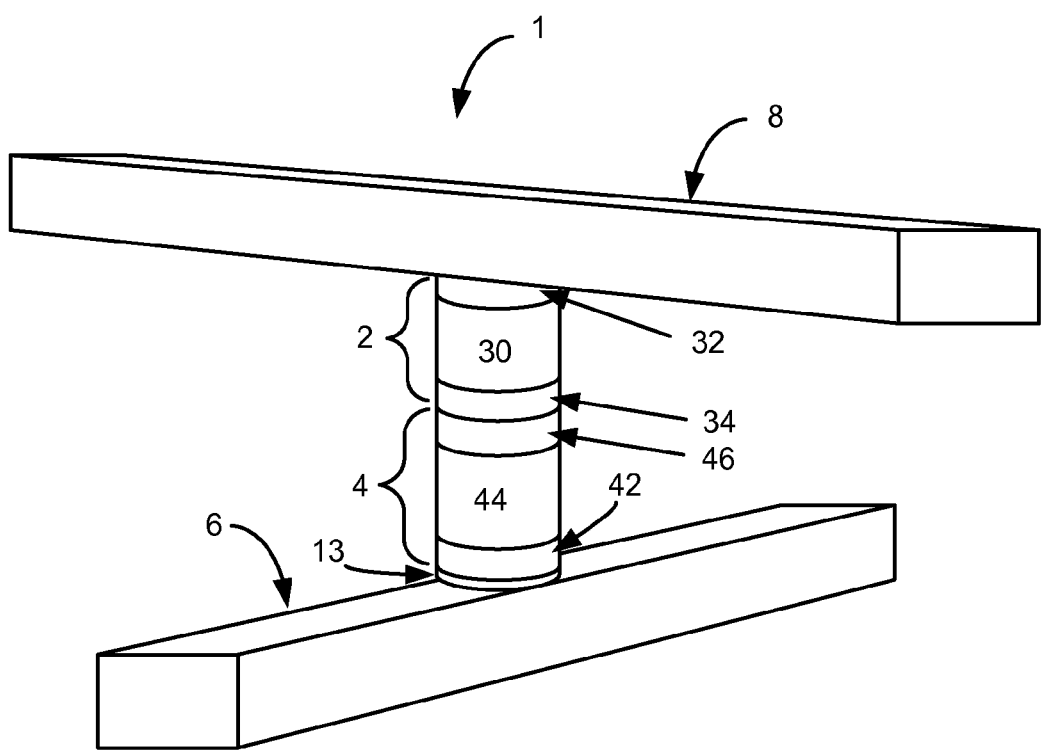
FIG. 1 is a simplified perspective view of one embodiment of a memory cell with a steering element.

Prior to discussing details of programming a memory cell, an example memory cell and system will be discussed. FIG. 1 is a simplified perspective view of one embodiment of a memory cell 1 which includes a reversible resistivity-switching element 2 coupled in series with a steering element 4 between a first conductor 6 and a second conductor 8. In some embodiments, the steering element 4 is a diode. In one embodiment, the diode steering element 4 is a p-i-n diode. For example, diode 4 may include a heavily doped n+ polysilicon region 42, a lightly doped or an intrinsic (unintentionally doped) polysilicon region 44 above the n+ polysilicon region 42, and a heavily doped p+ polysilicon region 46 above the intrinsic region 44. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 42 to prevent and/or reduce dopant migration from the n+ polysilicon region 42 into the intrinsic region 44, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed.

In another embodiment, the diode steering element 4 is a punch-thru diode. A punch-thru diode used as a steering element may be may be a N+/P−/N+ device or a P+/N−/P+ device. In another embodiment, the diode steering element 4 is a Schottky diode. In another embodiment, the diode steering element 4 is a back-to-back Schottky diode. In some embodiments, diode 4 may be formed from a polycrystalline semiconductor material such as polysilicon, germanium, or another semiconductor. Also, the diode steering element 4 may comprise more than one type of semiconductor. For example, diode 4 may be formed from a polycrystalline silicon-germanium alloy, polygermanium or any other suitable combination of semiconductors. In some embodiments, each region 42, 44, 46 of the diode steering element 4 is formed from the same material (but doped differently). However, it is not required that each region be formed from the same material. For example, a heterostructure may be possible.

Steering element 204 is not limited to being a diode. In one embodiment, the steering element 4 is a transistor. For example, a Field Effect Transistor (FET) can be used for the steering element 4.

Memory cell 1 has a reversible resistivity-switching element that includes a reversible resistivity-switching material 30, an upper electrode 32, and a lower electrode 34. Electrode 32 is positioned between reversible resistivity-switching material 30 and conductor 8. In one embodiment, electrode 32 is made of TiN. Electrode 34 is positioned between reversible resistivity-switching material 30 and steering element 4. In one embodiment, electrode 34 is made of titanium nitride, and may serve as a barrier layer Memory cell 1 has an electrode 13 at the bottom of the memory cell 1 to facilitate electrical contact between the steering element 4 and other circuit elements. In one embodiment, electrode 13 is formed from TiN. Note that the relative positions of the steering element 4 and the reversible resistivity-switching element 2 could be reversed. For example, the steering element 4 could be above the reversible resistivity-switching element 2.

Reversible resistivity-switching element 2 includes reversible resistivity-switching material 30 having a resistance that may be reversibly switched between two or more states. For example, the reversible resistivity-switching material may be in an initial high-resistance state upon fabrication that is switchable to a low-resistance state upon application of a first physical signal. For example, the reversible resistivity-switching element 2 may switch states in response to application of a first amount of energy, charge, heat, voltage, current or other phenomena. Application of a second amount of energy, charge, heat, voltage, current or other phenomena may return the reversible resistivity-switching material to the high-resistance state. Alternatively, the reversible resistivity-switching element may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used. Numerous reversible resistivity-switching materials and operation of memory cells employing reversible resistivity-switching materials are described, for example, in U.S. Patent Application Publication 2006/0250836, incorporated herein by reference in its entirety.

In some embodiments, reversible resistivity-switching material 30 may be formed from a metal oxide. Various different metal oxides can be used. The metal-oxide may be a transition metal-oxide. Examples of metal-oxides include, but are not limited to, $NiO$, $Nb_2O_5$, $TiO_2$, $HfO_2$, $Al_2O_3$, $MgO_x$, $CrO_2$, $VO$, $BN$, and $AlN$. In one embodiment, the memory element electrodes 32 and 34 are formed from TiN. More information about fabricating a memory cell using reversible resistivity-switching material can be found in United States Patent Application Publication 2009/0001343, filed on Jun. 29, 2007, entitled "Memory Cell that Employs a Selectively Deposited Reversible Resistance Switching Element and Methods of Forming the Same," which is hereby incorporated herein by reference in its entirety. In some embodiments a bipolar metal oxide switching element is used. In some of those embodiments, the electrode materials may be different in work function or other properties and may be chosen to form a switching element with a preferential pulse polarity for SET opposite the preferred pulse polarity for RESET. In one example of a bipolar embodiment, the top electrode is TiN and the bottom electrode is n+ doped polysilicon and the switching element comprises a HfOx layer on the bottom and a TiOx buffer layer on top.

Conductors 6 and 8 may include any suitable conductive material such as tungsten, any appropriate metal, heavily-doped semiconductor material, a conductive silicide, a conductive silicide-germanide, a conductive germanide, or the like. In the embodiment of FIG. 1, conductors 6 and 8 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 6 and 8 to improve device performance and/or aid in device fabrication.

FIG. 1 shows a memory cell 1 in a cylindrical shape and conductors in the shapes of rails. However, the technology described herein is not limited to any one specific structure for a memory cell. Other structures can also be used to form memory cells that include reversible resistivity-switching material. For example, the following patents provide examples of structures of memory cells that can be adapted to use reversible resistance-switching material: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377.

As discussed above, a memory cell can be programmed by performing a SET or RESET operation. In one embodiment, both the SET and RESET operations are performed by applying appropriate voltages. For example, a SET voltage can be applied to SET a memory cell and a RESET voltage can be applied to RESET the memory cell. In one example implementation, the SET voltage is applied as a voltage pulse and the RESET voltage is also applied as a voltage pulse. Note that although an ideal pulse may have a rectangular shape, the use of the term pulse can include a broader variety of shapes that approximate the real-world behavior of a signal ramped up and ramped down from a maximum magnitude. In unipolar operation, both the SET voltage and RESET voltage can be accomplished using pulses of positive voltages. With bipolar operation, one of the SET and RESET operations will use a positive voltage pulse and the other of RESET and SET operations will use a negative pulse. Instead of a pulses, other voltage conditions can be used.

For bipolar switching, a relatively high current is often required for both the SET operation and RESET operation. When a positive voltage is applied across a diode being used a steering element in a memory cell, the diode will be forward biased; therefore, current will flow through the diode. For an ideal diode, when a negative voltage is applied to the diode, no current will flow through the diode. Therefore, to accomplish a SET or RESET operation using a negative voltage, some implementations will cause a diode to go into the breakdown mode of operation. With some diodes, if a large enough negative voltage is applied across a diode, the pn junction will break down and a reverse current will flow through the diode. However, operating the diode in the breakdown mode increases the chances of device failure or degradation.

As discussed above, when a reverse bias (e.g., negative voltage) is applied, the ideal diode will not conduct any current. However, an actual implementation of a diode will experience some leakage current when reverse biased. In most implementations, designers of electrical components seek to minimize the reverse leakage current. While minimizing conventional reverse leakage remains the goal, the technology described herein will take advantage of the much higher reverse current, when the device is reverse biased, under certain transient conditions, in order to program the memory cell using that reverse current. Thus, one programming mode (either SET or RESET) will use a forward bias voltage condition to perform the programming operation while the other programming mode will use a reverse bias voltage condition to program (the other of SET or RESET) using the reverse current that results from the reverse bias voltage applied across the diode.

In order to program the reversible resistance switching element 2 of FIG. 1, a large enough current must be present. The conventional reverse leakage current that can be, for instance, in pico Amp to nano Amp range is typically not sufficient. Therefore, the reverse bias current should be increased without putting the diode in breakdown mode. The proposed solution to obtain enough reverse current without putting the diode in breakdown mode is to use a forward bias (with respect to the diode) to store charge in the diode and then use a reverse bias to achieve high amplitude reverse transient current (referred to as diode reverse recovery current), at lower than breakdown voltage. Therefore, in one example implementation, the system will apply transient pulses of alternate polarity to the memory cells. Depending on the reversible resistance-switching material, the pulses of alternate polarity can be used for SET or RESET, with the other programming operation receiving one or more pulses of positive voltage.

FIG. 2 is a graph showing the IV characteristics of a diode over time. Line 80 plots voltage versus time for the diode V=V(t). Line 82 plots current versus time I=I(t). The voltage VF represents the forward biasing voltage for the diode. The value IF represents the current flowing when the diode is forward biased. The voltage VR represents a voltage that puts the diode in reverse bias (e.g. negative voltage with respect to the diode). The current IRmin represents the current flowing the diode at nearly steady state and represents what is typically called diode reverse leakage when the diode is reverse biased. In practice, Imin may be in the nano Amp range or lower. It has been found that during forward bias, a diode will store charge. When the voltage across the diode is quickly transitioned from a forward bias to a reverse bias, there will be a high reverse current IRM (diode reverse recovery current) for a small period of time ts (called high reverse conductivity stage). Subsequently, the current will be reduced to a steady state leakage (approaching the level of steady state reverse leakage e.g. of pico- to nano amps) during recovery time period trr (reverse recovery stage). During the time period ts+trrr, (total reverse recovery time) diode reverse recovery current will flow through the diode and, therefore, through the reversible resistance-switching material that is in series with the diode. If the magnitude of VR is greater than the magnitude of VF, and VR is less than the breakdown voltage for the diode, then the current IRM can potentially be higher than the current IF, depending on diode parameters. In such a case, a high reverse current during diode reverse recovery (ts+trr) may be achieved.

One explanation for the diode reverse recovery current is that when the voltage bias across the diode is reversed, the holes and electrons that are injected and accumulated in the effective intrinsic region of the diode (in intrinsic region and lower doped parts of the N+ and P+ emitters) during the forward pulse, are extracted, which dissipates the charge in the intrinsic region. During that extraction and recombination process, the diode will conduct in the reverse direction. To increase the diode reverse recovery current to allow for programming the reversible resistance-switching material, it is beneficial to slow down the recombination rate. Since one of the key recombination mechanisms in poly silicon is trap-assisted recombination, the overall recombination rate can be reduced by reducing trap density. One means for reducing trap density is to improve polysilicon crystallinity. The goal is to get as close to a single grain diode as possible. That is, the design of the diode will seek to increase the grain size, with a single crystal diode as the goal. Crystalline silicon which has one grain (and, therefore, no grain boundaries) is desired. Reducing the number of grains reduces the defect/trap density, which can reduce recombination rate. In many other applications circuit designers want to speed up the recovery process in a diode; however, the technology described herein seeks to slow down the recovery and take advantage of that recovery. Strategies to increase grain size include silicidation, thermal annealing in an inert gas, and passivation. As a significant side benefit, reducing the trap density and overall recombination rate will also increase diode forward current which is beneficial for RRAM applications.

To obtain the desired diode reverse recovery current, a sufficient forward biasing voltage is used to cause the diode to store enough charge. Increasing the P+ and N+ doping level will allow more carriers to be injected in the intrinsic region during the forward bias to increase the charge stored.

Figure 3A:
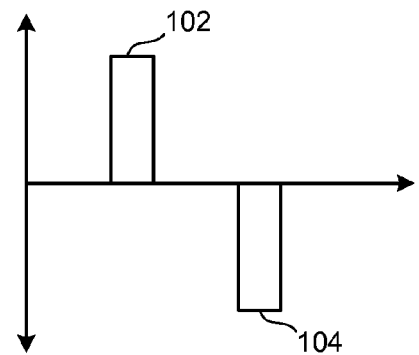

FIG. 3A shows a graph with two pulses 102 and 104. Pulse 102 represents a positive voltage pulse and pulse 104 represents a negative voltage pulse. Pulses 102 and 104 represent prior art bipolar operation. For example, pulse 102 can be used to SET a memory cell by applying a forward bias and pulse 104 can be used to RESET the same memory cell by applying a reverse bias. Alternatively, pulse 104 can be used to SET the memory cell and pulse 102 can be used to RESET the memory cell.

Figure 3B:
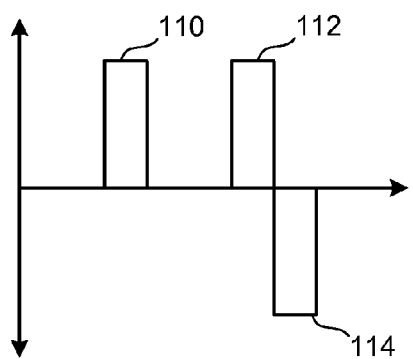

The technology described herein, proposes a new scheme for bipolar operation whereby one of the programming operations (either SET or RESET) is performed by using a positive voltage condition (e.g., positive voltage pulse), and the other programming operation (either SET or RESET) is performed by applying one or more pairs of opposite polarity voltage conditions to the reversible resistance-switching memory cell. FIG. 3B provides a graphic example of this technique. For example, positive voltage pulse 110 is an example of a voltage condition which can be used for a RESET operation. When applying positive voltage pulse 110, the diode (other steering device) of the memory cell will be forward biased. Therefore, current will flow through the diode and through the reversible resistance-switching material. If the appropriate voltage is applied, the programming operation will be performed. The SET operation is performed by applying the pair of pulses 112 and 114.

The pair of opposite polarity voltage conditions depicted in FIG. 3B includes positive voltage pulse 112 and negative voltage pulse 114. Positive voltage pulse 112 provides a forward bias (a first polarity) to the steering element 4 such that current will flow through reversible resistance-switching material 2 and steering element 4 will store some amount of charge. Negative voltage pulse 114 will provide a reverse bias (second polarity) to steering element 4 such that steering element 4 will experience some diode reverse recover current that will be used to change the resistance state of reversible resistance-switching material 2.

In the example depicted in FIG. 3B, positive voltage pulse 112 immediately transitions into negative voltage pulse 114. This means that there is no time gap between the two pulses such that the second pulse is applied immediately after the first pulse. Additionally, the end of pulse 112 becomes the beginning of pulse 114. Thus, pulse 112 transitions into pulse 114.

In other embodiments, the SET operation is performed by the forward biasing voltage condition and the RESET operation is performed by the application of one or more pairs of opposite polarity voltage conditions being applied to the resistance-switching memory cell.

If the voltage waveform of FIG. 3B is applied to a reversible resistance-switching memory cell (e.g., memory cell 1 of FIG. 1), then the reversible resistance-switching memory cell will be changed to a first resistance state in response to voltage pulse 110. Subsequently, the reversible resistance-switching memory cell will be changed from the first resistance state to a second resistance state by applying the pair of opposite polarity voltage conditions (e.g., positive voltage pulse 112 and negative voltage pulse 114).

Figure 3C:
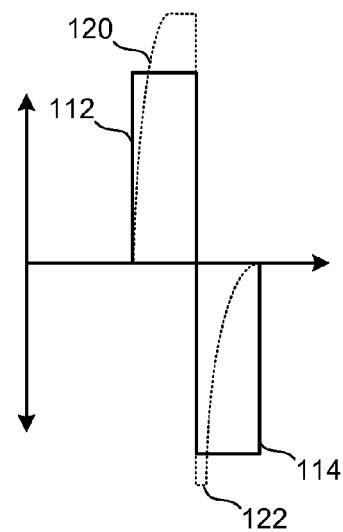

FIG. 3C shows the waveform for pulses 112 and 114 superimposed on waveforms 120 and 122, which depict the current flowing through the diode as a result of the voltage pulses.

In the embodiment of 3B, only one positive voltage pulse 110 is depicted for transitioning the memory cell to a first resistance state and only one pair of opposition polarity voltage pulses are depicted for transitioning reversible resistance-switching memory cell from the first resistance state to the second resistance state. In other embodiments, more than one pulse can be used to change the reversible resistance-switching memory cell to the first state and more than one pair of opposite polarity voltage pulses can be used to transition the reversible resistance-switching memory cell from the first resistance state to the second resistance state. For example, FIG. 3D shows three positive pulses 130 being used to transition the memory cell to the first resistance state and three pairs of opposite polarity voltage pulses 132 being used to transition to the reversible resistance-switching memory cell from the first resistance state to the second resistance state. Although three pulses are depicted, more or less than three pulses can be used for each programming operation.

In some embodiments, the system will perform some amount of programming, followed by verification of whether the programming was successful. If the programming was successful, then no more programming needs to be performed. If the programming was not successful, additional programming will be performed. In such a case, the system may apply a series of voltage conditions (e.g., pulses), with verification being performed between the application of the voltage conditions (e.g., pulses). For example, FIG. 3E shows positive pulses 140, 142 and 144, each designed to perform a programming operation. In between each of the programming pulses 140, 142 and 144, the system will verify whether the device has completed the intended programming. Once the device has completed the intended programming, no more pulses will be applied.

FIG. 3E also shows three pairs of opposite polarity voltage pulses 150/152, 154/156 and 158/160. Between each pair of opposite polarity voltage pulses, the system will perform a verification process to see whether the reversible resistance-switching memory cell has properly programmed. The graph of FIG. 3E shows one pair of opposite polarity pulses being performed between verification processes. In some embodiments, multiple pulses or multiple pairs of pulses of opposite polarity will be applied between verification processes. For example, the system may apply three of more pairs of opposite polarity voltage pulses (as shown in FIG. 3D), then verify, then repeat the three or more pairs of opposite polarity voltage pulses, etc. With each pair of opposite polarity voltage pulses (or other voltage condition), the positive pulse will cause the diode to be in forward bias and will charge the diode, and the negative pulse will cause the diode to transition to reverse bias such that the reverse recovery current will flow for a short period of time with enough magnitude to perform the programming operation without causing the diode to operate in breakdown condition.

FIG. 4 is a flowchart describing one embodiment of a process for operating a memory system that can be programmed as discussed above with respect to FIGS. 3B-3E. Some reversible resistance switching materials must be FORMED prior to programming. Typically, the forming process includes applying a voltage with a magnitude higher than the voltage necessary for SET or RESET. The forming process prepares a material to be able to reliably switch resistance states as described herein. Step 164 of FIG. 4 includes performing a FORMING operation. In step 166, one or more memory cells can be programmed by changing their resistance states, as described above. In one embodiment, step 166 includes applying a single polarity of voltage conditions. In step 168, one or more memory cells can be read one or more times. In some embodiments, step 168 is optional. In step 170, one or more memory cells are programmed by changing the resistance state. The process of programming at step 170 includes applying one or more pairs of opposite polarity voltage conditions as described above. For example, programming of step 166 can utilize positive voltage pulses 130 and the programming of step 170 can use the multiple pairs of opposite polarity voltage pulses 132. In one embodiment, step 166 can be used to SET memory cells and step 170 can be used to RESET memory cells. In other embodiments, step 166 can be used to RESET memory cells and step 170 can be used to SET memory cells. In some embodiments, steps 166 and 170 can be performed concurrently, while in other embodiments they are performed at different times. In step 172, one or more memory cells can be read one or more times. In some embodiments, step 172 is optional. Thereafter, memory cells can continue to be programmed (steps 166 and 170) or read (step 168 and 172), randomly, serially or in any order suitable for the application.

Figure 5:
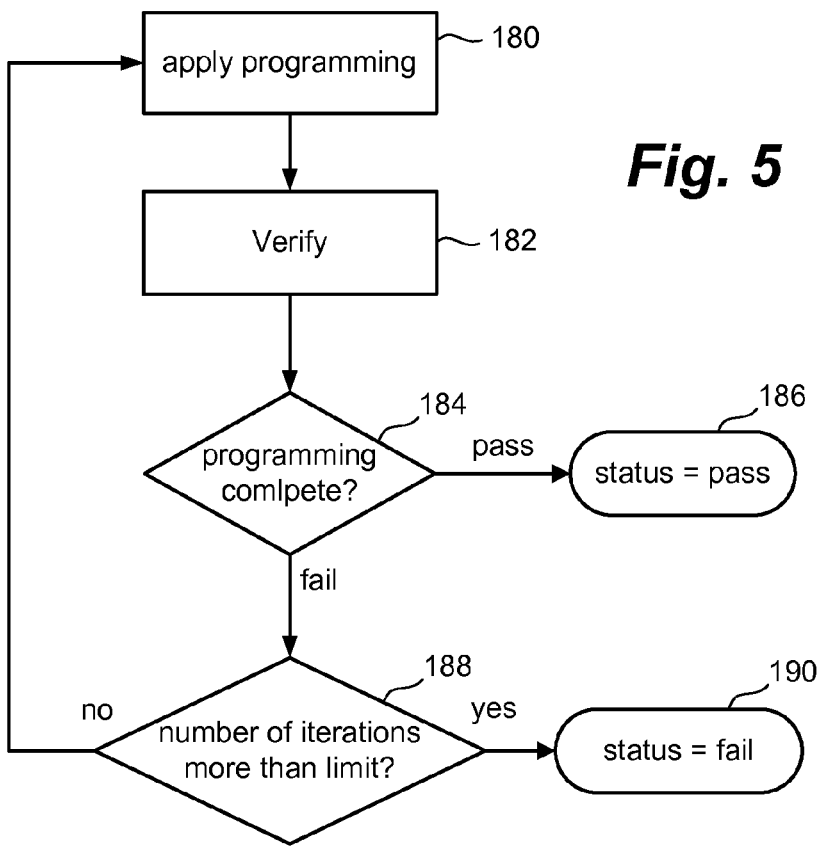
FIG. 5 is a flow chart describing one embodiment of a process for programming one or more memory cells.

FIG. 5 is a flowchart describing one embodiment of the processes for programming memory cells. For example, the process of FIG. 5 can be used to implement steps 166 and/or step 170. In step 180 of FIG. 5, programming is applied to the selected memory cell. That is, one or more positive voltage pulses (e.g., pulses 130) can be applied or one or more pairs of opposite polarity voltage pulses (e.g., pulses 132) can be applied, depending on which programming operation is being performed. In some embodiments, one memory cell is programmed at a time. In other embodiments, multiple memory cells can be concurrently programmed. In step 182, the memory cells selected for programming are verified to determine whether programming is complete. If the programming is complete (step 184), then the process is finished and reports a status (e.g., pass) in step 186. If the program is not complete, then it is determined whether the number of iterations of programming is more than a predefined limit (step 188). If the number of programming iterations is not more than a predefined limit, then the process will perform the next program iteration by looping back to step 180 and applying additional programming. If the number of programming iterations is greater than the predetermined limit, then the process has failed and will report its failure in step 190. One example of the predetermined limit for the number of programming iterations is five. If the status is fail (step 190), system control logic 330 on the memory chip or a host device may take further corrective action such as using redundant memory cells Error correcting logic or recovery pulses applied to the failed cell.

Memory System

Figure 6:
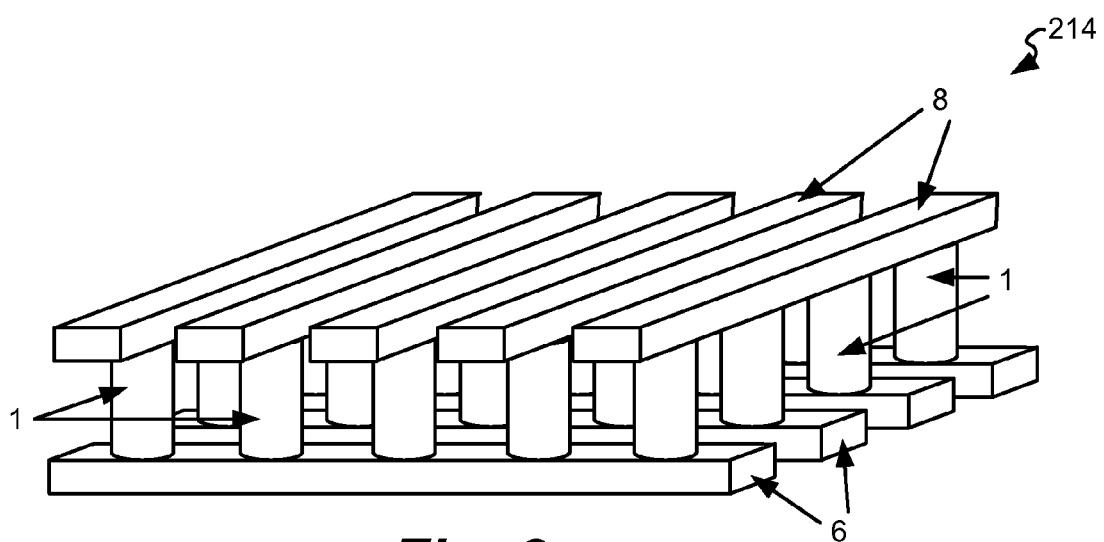
FIG. 6 is a simplified perspective view of a portion of a first memory level formed from a plurality of the memory cells of FIG. 1.

The above-described reversible resistance-switching memory cell, with the above described programming process, can be used in a non-volatile storage system. FIG. 6 is a simplified perspective view of a portion of a first memory level 214 formed from a plurality of the memory cells 1 of FIG. 1 that can be programmed as described above. For simplicity, the reversible resistivity-switching element 2 and the steering element 4 are not separately shown. The memory array 214 is a "cross-point" array including a plurality of first conductors 6 (e.g., bit lines) and a plurality of second conductors 8 (e.g., word lines) between which multiple memory cells are coupled (as shown). Other memory array configurations may be used, as may multiple levels of memory.

Figure 7:
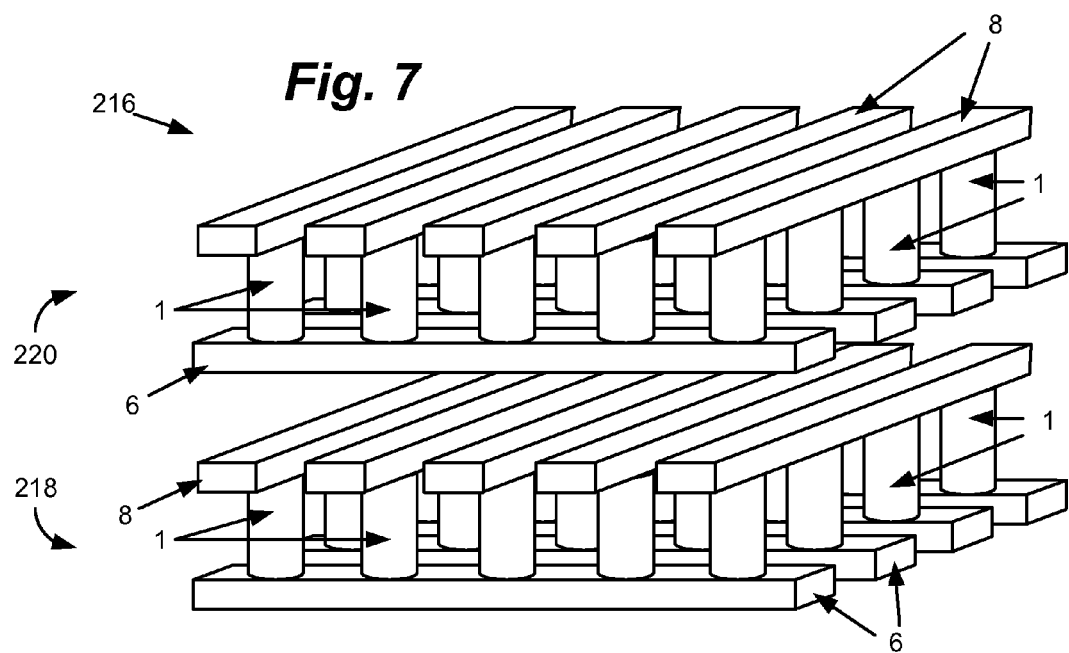
FIG. 7 is a simplified perspective view of a portion of a three dimensional memory array.

FIG. 7 is a simplified perspective view of a portion of a monolithic three dimensional array 216 that includes a first memory level 218 positioned below a second memory level 220. In the embodiment of FIG. 7, each memory level 218 and 220 includes a plurality of memory cells 1 in a cross-point array. It will be understood that additional layers (e.g., an inter-level dielectric) may be present between the first and second memory levels 218 and 220, but are not shown in FIG. 7 for simplicity. Other memory array configurations may be used, as may additional levels of memory. In the embodiments of FIGS. 6 and 7, all steering devices (e.g., diodes) may "point" in the same direction, such as upward or downward depending on whether p-i-n diodes having a p− doped region on the bottom or top of the diode are employed, simplifying diode fabrication.

Figure 8:
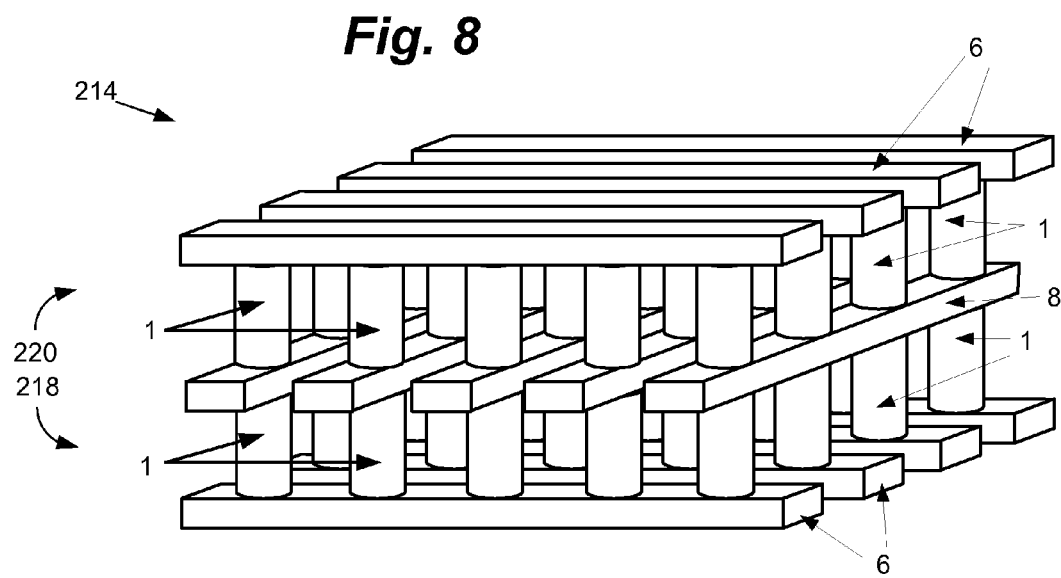
FIG. 8 is a simplified perspective view of a portion of a three dimensional memory array.

In some embodiments, the memory levels may be formed as described in U.S. Pat. No. 6,952,030, "High-Density Three-Dimensional Memory Cell," which is hereby incorporated by reference herein in its entirety. For instance, the upper conductors 8 of a first memory level 218 may be used as the lower conductors 8 of a second memory level 220 that is positioned above the first memory level 218 as shown in FIG. 8. In such embodiments, the diodes on adjacent memory levels preferably point in opposite directions, as described in U.S. patent application Ser. No. 11/692,151, filed Mar. 27, 2007 and titled "Large Array Of Upward Pointing P-I-N Diodes Having Large And Uniform Current," which is hereby incorporated by reference herein in its entirety. For example, the diodes of the first memory level 218 may be upward pointing diodes, while the diodes of the second memory level 220 may be downward pointing diodes, or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Figure 9:
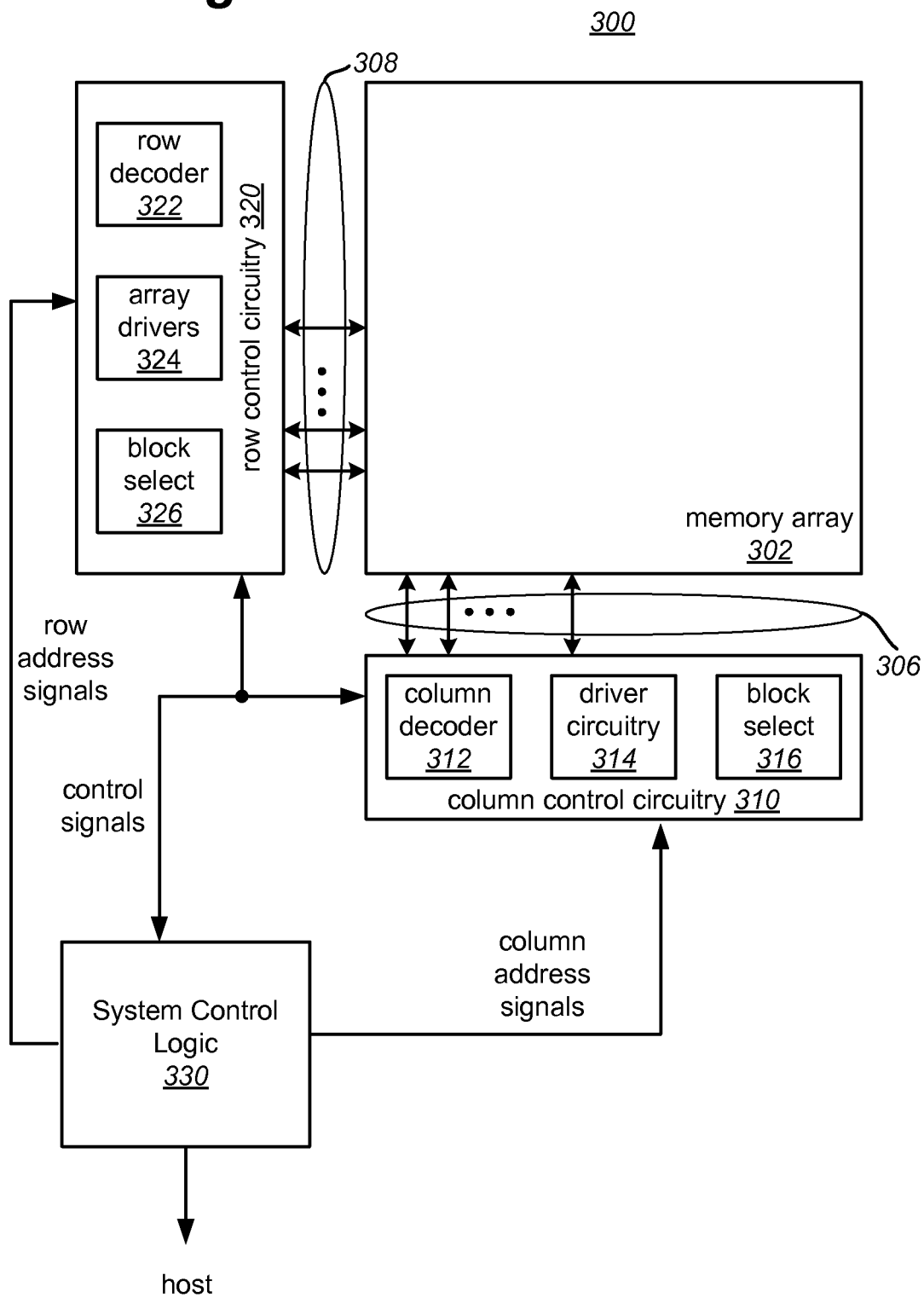
FIG. 9 is a block diagram of one embodiment of a memory system.

FIG. 9 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. In one embodiment column decoder 312 is a reversible polarity decoder circuit. In one embodiment row decoder 322 is a reversible polarity decoder circuit. In one embodiment, a reversible polarity decoder circuit has active low output in one mode and active high output in another mode. Further details of reversible polarity decoder circuits are described in U.S. Pat. No. 7,542,370, filed on Dec. 31, 2006, which is hereby incorporated herein in its entirety.

System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

Integrated circuits incorporating a memory array usually subdivide the array into a number of sub-arrays or blocks. Blocks can be grouped together into bays that contain, for example, 16, 32, or a different number of blocks. Each block in a monolithic three dimensional memory may have many layers of memory cells. For example, a block might include 8 layers. Each layer may include hundreds, or thousands of bit lines and word lines. For example, a layer might have about a thousand bit lines and about 8 thousand word lines. In some implementations, there is a bit line driver associated with each bit line. Note that a given driver could be shared between two or more bit lines. Also note that it is not required that a given bit line have only one driver associated therewith. In some implementations, some of the drivers are physically located on one end of the bit lines and other drivers on the other end of the bit lines.

As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

In one embodiment, all of the components depicted in FIG. 9 are arranged on a single integrated circuit. For example, system control logic 330, column control circuitry 310, and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array 302. In one embodiment, any combination of one or more of system control logic 330, column control circuitry 310, column decoder 312, driver circuitry 314, block select 316, row control circuitry 320, block select 326, array drivers 324, row decoder 322 or analogous circuits can be referred to as one or more managing circuits.

Figure 10:
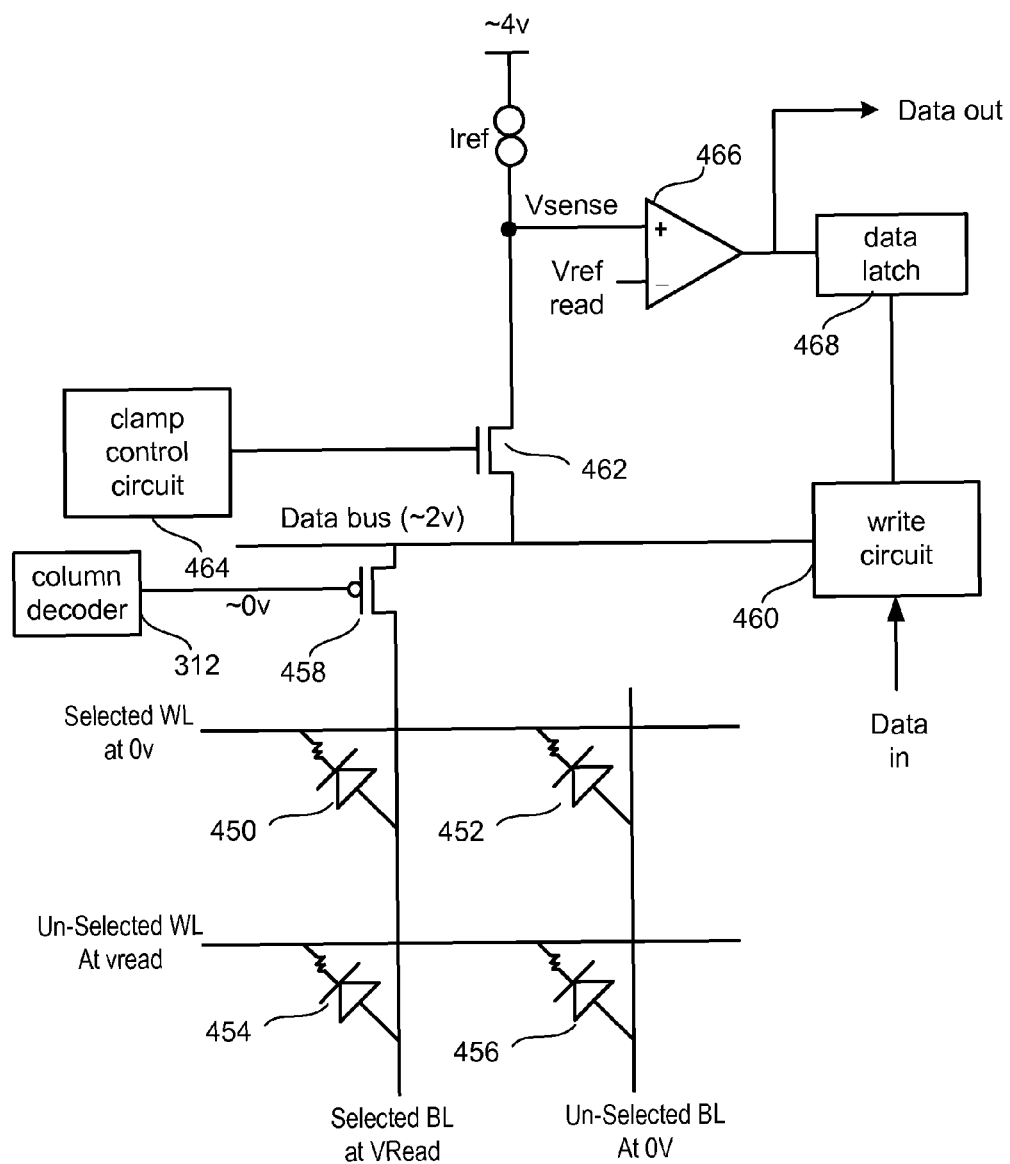
FIG. 10 depicts a circuit that can read the state of a memory cell.

FIG. 10 depicts a circuit that illustrates one embodiment for reading the state of a memory cell. To determine which state memory cell is in, a voltage may be applied and the resulting current is measured. A higher measured current indicates that the memory cell is in the low-resistivity state. A lower measured current indicates that the memory cell is in the high-resistivity state. FIG. 10 shows a portion of a memory array including memory cells 450, 452, 454 and 456, which may be based on the embodiment of FIG. 1. In this example, the steering element 4 is a diode. Two of the many bit lines and two of the many word lines are depicted. A read circuit for one of the bit lines is depicted to be connected to the bit line via transistor 458, which is controlled by a gate voltage supplied by column decoder 312 in order to select or unselect the corresponding bit line. Transistor 458 connects the bit line to a Data bus. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to comparator 466 and reference current supply $I_{REF}$. The output of comparator 466 is connected to a data out terminal (to system control logic 330, a controller and/or a host) and to data latch 468. Write circuit 460 is also connected to data latch 468.

When attempting to read the state of the selected memory cell, all word lines are first biased at Vread (e.g., approximately 2 volts) and all bit lines are at ground. The selected word line is then pulled to ground. For example purposes, this discussion will assume that memory cell 450 is selected for reading. One or more selected bit lines are pulled to Vread through the data bus (by turning on transistor 458) and the clamp device (transistor 462, which receives ~2 volts+Vt). The clamp device's gate is above Vread but controlled to keep the bit line near Vread. Current is pulled by the selected memory cell through transistor 462 from the $V_{SENSE}$ node. The $V_{SENSE}$ node also receives a reference current $I_{REF}$ that is between a high-resistance state current and a low-resistance state current. The $V_{SENSE}$ node moves corresponding to the current difference between the cell current and the reference current $I_{REF}$. Comparator 466 generates a data out signal by comparing the $V_{SENSE}$ voltage to a Vref-read voltage. If the memory cell current is larger than $I_{REF}$, the memory cell is in the low-resistance state and the voltage at $V_{SENSE}$ will be lower than $V_{REF}$. If the memory cell current is smaller than $I_{REF}$, the memory cell is in the high-resistance state and the voltage at $V_{SENSE}$ will be higher than $V_{REF}$. The data out signal from comparator 466 is latched in data latch 468. In some embodiments, the reference current is based on the address of the memory cell.

Figure 11:
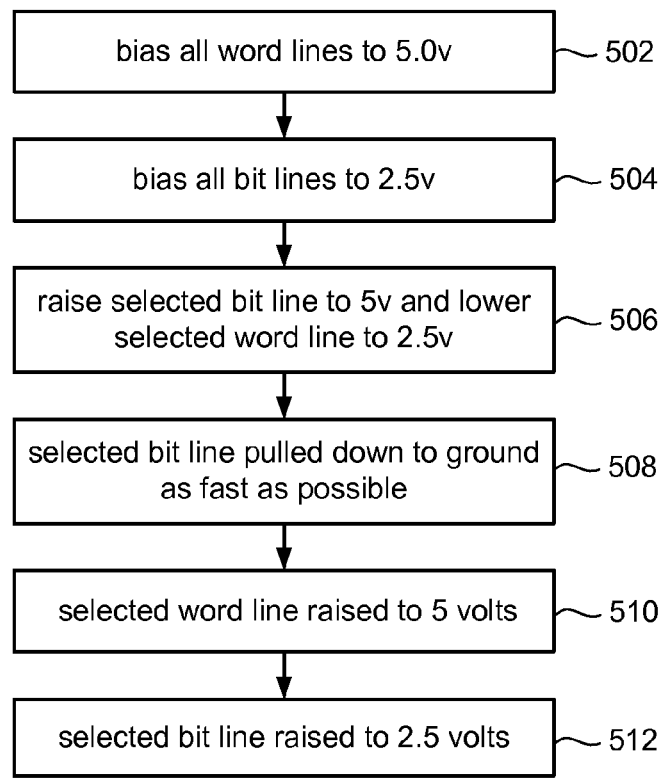
FIG. 11 is a flow chart describing one embodiment of a process for programming one or more memory cells.
Figure 12:
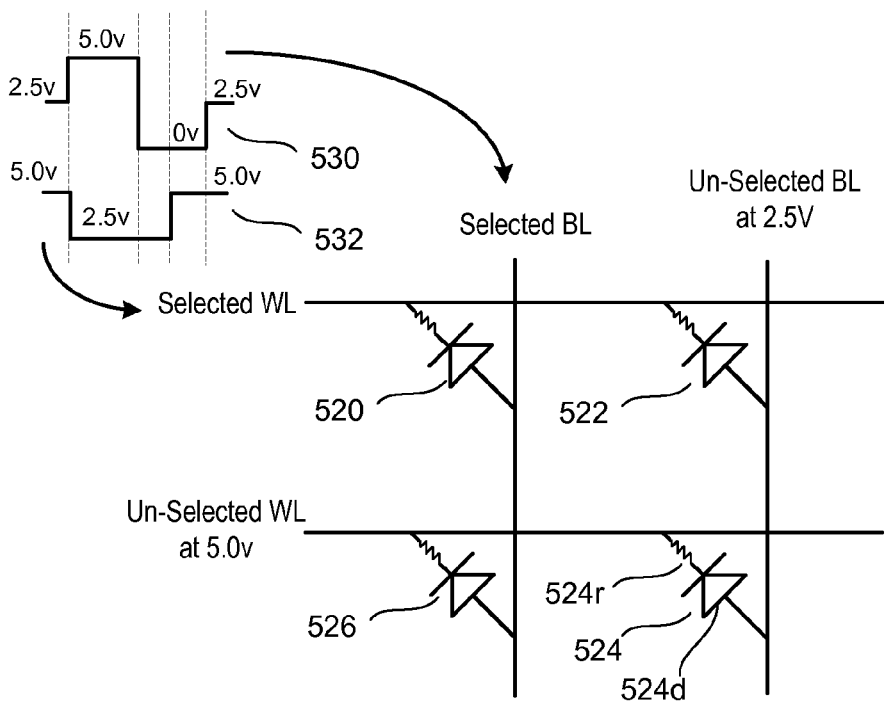
FIG. 12 depicts a portion of a memory array and the signals used to program a selected memory cell.

FIG. 3B-FIG. 5 describe technology for programming one or more memory cells by applying one or more pairs of opposite polarity voltage conditions to the memory cell. FIGS. 11 and 12 describe one embodiment for implementing that programming process in the memory system of FIGS. 6-10. FIG. 11 is a flow chart describing the method of programming and FIG. 12 graphically shows the appropriate signals being applied to a portion of the memory array. FIG. 12 shows four memory cells 520, 522, 524 and 526. Each memory cell includes a steering element, such as diode 524d, and a reversible resistance-switching material, such as device 524r. In the example of FIG. 12, one of the memory cells, memory cell 520, is selected for programming. Two bit lines and two word lines are also depicted. One of the bit lines connecting to memory cell 520 is the selected bit line and the other bit line is an un-selected bit line. The word line is connected to memory cell 520 is the selected word line. Other words lines are the un-selected word lines. Note that in embodiments where multiple memory cells are programmed at the same time, there will be multiple selected bit lines. Additionally, if not all memory cells will be programmed at the same time, there will be multiple un-selected bit lines. There is likely to be multiple un-selected word lines. In one embodiment, the memory cells are directly connected to the bit lines and word lines. However, the memory cells can also be connected to the bit lines and word lines indirectly, such as through one or more other components.

In the programming process of FIGS. 11 and 12, the selected memory cell first receives a 2.5 volt forward bias as the first voltage condition of the pair of opposite polarity voltage conditions. For the second voltage condition of the pair of opposite polarity voltage conditions, a rapid transient of the bit line voltage reverse biases memory cell 520 and the stored charge flows through the reversible resistance-switching material in a reverse direction relative to the normal forward bias current direction of the memory cell, and thereby switches the memory cell resistance into the SET state. This will be described in more detail with respect to the steps of FIG. 11.

The steps of FIG. 11 provide one example implementation of applying a pair of opposite polarity voltage conditions to reversibly resistance-switching memory cell. That is, the process of FIG. 11 can be performed as part of step 180 of FIG. 5. In step 502, all word lines are biased to 5 volts. In step 504, all bit lines are biased 2.5 volts. Steps 502 and 504 can be performed to the same time or at different times. Subsequently, in step 506, the selected bit line is raised to 5 volts and a selected word line is lowered to 2.5 volts. When the selected bit line is at 5 volts and the selected word line is at 2.5 volts, memory cell 520 (and its diode) are forward biased and receiving a positive voltage (e.g., similar to voltage pulse 112). In step 508, the selected bit line is pulled down to ground as fast as possible to reverse bias of the selected memory cell by 2.5 volts (e.g., similar to negative voltage pulse 114 of FIG. 3B). The reverse bias releases the stored charge to provide a diode reverse recovery current for the memory cell. The un-selected word lines are biased to about 5 volts to allow the initial bit line voltage of 5 volts. The un-selected bit lines are biased at 2.5 volts to allow the selected word line voltage of 2.5 volts. Memory cell 524 is biased at 2.5 volts, reverse bias relative to the diode polarity. Memory cell 526 has a 5 volt reverse bias when the bit line is pulled down to ground, but there is no significant stored charge in the diode of memory cell 526 before the fast bit transient so the memory cell is not disturbed and avoids programming. In step 510, the selected word line is raised back to 5 volts. In step 512, the selected bit line is raised back to 2.5 volts, and the process is completed. In this embodiment, the pair of opposite polarity voltage conditions include the forward bias of step 506 that immediately transitions into the negative bias as step 508. Waveform 530 of FIG. 12 shows the signal being applied to the selected bit line. Waveform 532 shows the signal being applied to selected word line.

Figure 13:
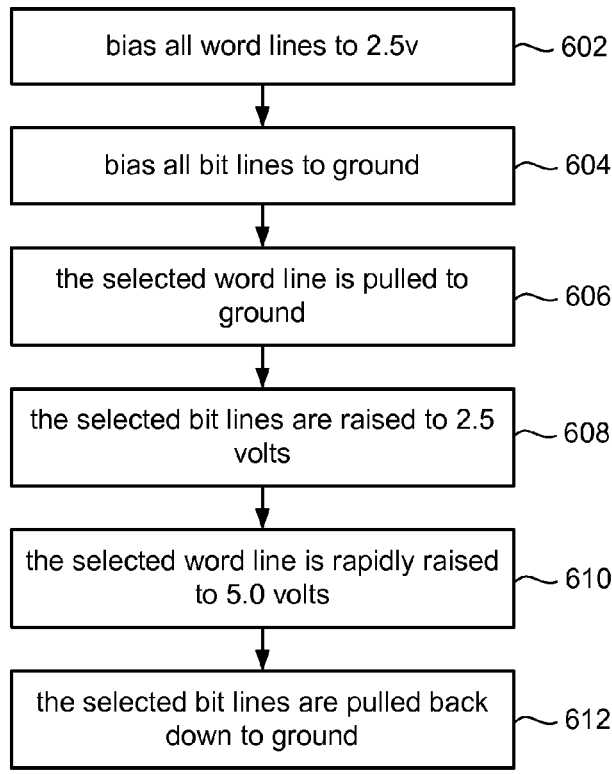
FIG. 13 is a flow chart describing one embodiment of a process for programming one or more memory cells.
Figure 14:
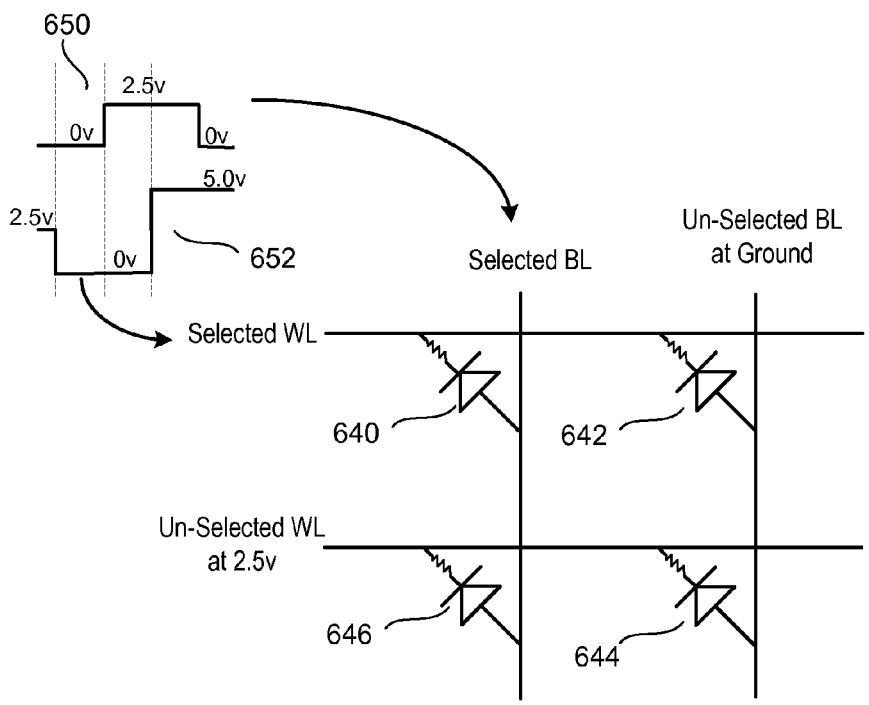
FIG. 14 depicts a portion of a memory array and the signals used to program a selected memory cell.

FIGS. 13 and 14 describe one embodiment for implementing that programming process in the memory system of FIGS. 6-10. FIG. 13 is a flow chart describing the method of programming and FIG. 14 graphically shows the appropriate signals being applied to a portion of the memory array. FIG. 14 shows four memory cells 640, 642, 644 and 646. Each memory cell includes a steering element and reversible resistance-switching material. In the example of FIG. 14, one of the memory cells, memory cell 640, is selected for programming. Two bit lines and two word lines are also depicted. One of the bit lines connecting to memory cell 640 is the selected bit line and the other bit line is an un-selected bit line. The word line is connected to memory cell 640 is the selected word line. Other words lines are the un-selected word lines.

In step 602 of FIG. 13, all word lines are biased at 2.5 volts. In step 604, all bit lines are at ground. In step 606, the selected word line is pulled to ground. In step 608, the selected bit line is pulled to 2.5 volts, which causes a forward biasing voltage condition to the diode of the selected memory cell. It is during this time that the diodes will store charge (analogous to positive voltage pulse 112 of FIG. 3B). In step 610, the selected word line is rapidly pulled to 5 volts, driving the selected memory cells 640 to a reverse bias of 2.5 volts. Memory cell 642 will also see a negative 5 volt stress. Memory cell 644 is at −2.5 volts. Before the fast transient of the word line in step 610, memory cells 642 and 646 are at 0 bias and have minimum stored charge, which reduces the chance of half selected memory cells experiencing unintended programmed. In step 612 of FIG. 13, selected bit lines are pulled back down to ground. The waveform for the selected bit line is shown in waveform 650. Waveform 652 shows the signal being applied to selected word line.

Figure 15:
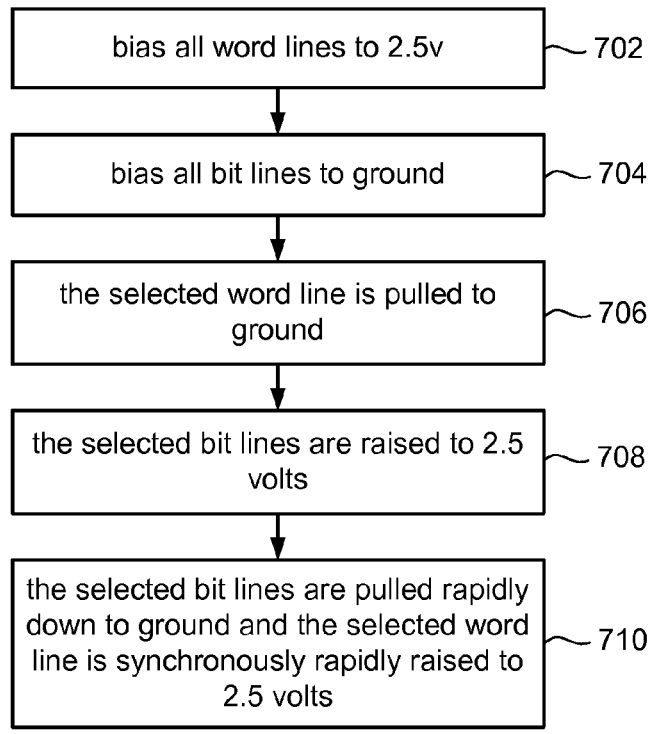
FIG. 15 is a flow chart describing one embodiment of a process for programming one or more memory cells.
Figure 16:
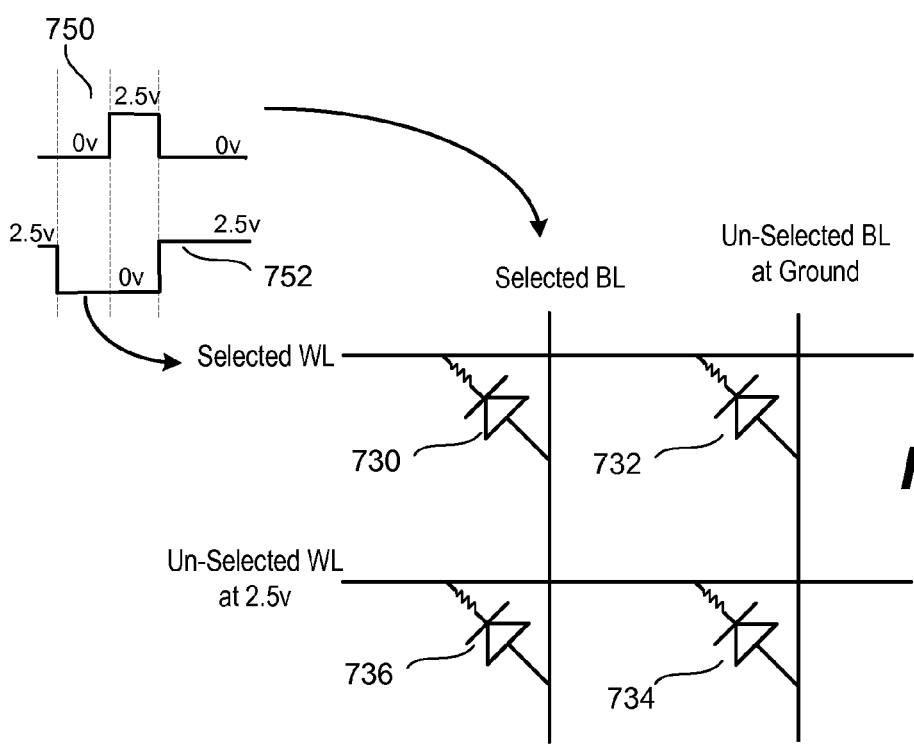
FIG. 16 depicts a portion of a memory array and the signals used to program a selected memory cell.

FIGS. 15 and 16 depict another embodiment for programming memory cells using the scheme of FIG. 3B-FIG. 5 with the memory system of FIGS. 6-10. That is, the process of FIG. 15 is one example implementation of applying one or more pairs of opposite polarity voltage conditions to a reversibly resistance-switching memory cell as part of step 180 of FIG. 5. FIG. 16 shows a portion of a memory array that includes memory cell 730, 732, 734 and 736. In this example, memory cell 730 is selected for programming. Waveform 750 depicts the signal being provided to the selected bit line. Waveform 752 depicts the signal being applied to the selected word line.

In step 702 of FIG. 15, all of the word lines are biased at 2.5 volts. In step 704, the bit lines are biased to ground. In step 706, the selected word line is pulled to ground. In step 708, the selected bit line is pulsed to 2.5 volts. While the selected bit line is at 2.5 volts and the word line is at ground, selected memory cell 730 is receiving a positive bias of 2.5 volts (analogous to negative voltage pulse 114 of FIG. 3B). In step 710, the selected bit line is rapidly pulled down to ground and the selected word line is synchronously rapidly raised to 2.5 volts thereby providing a reverse bias of −2.5 volts to selected memory cell 730 (analogous to negative voltage pulse 114 of FIG. 3B). Source bias lines to the bit line and word line drivers are used to provide synchronous fast pulses on the bit line falling edge and word line rising edge. Source line transients are adjusted to anticipate the travel time down source lines and the array lines. For example, a source line transient for a word line selecting a cell near the end of a bit line would be later than the transient for a selected word line selecting a memory cell at the near end of the bit line. The address information is used to adjust the transient timing for the various locations of bits along the array lines.

The above-described embodiment provide examples of changing the reversible resistance-switching memory cell from the first resistance state to a second resistance state by applying one or more pairs of opposite polarity voltage conditions to the reversible resistance-switching memory cell.

One embodiment of a method for programming a storage system comprises changing a reversible resistance-switching memory cell to a first resistance state and changing the reversible resistance-switching memory cell from the first resistance state to a second resistance state by applying one or more pairs of opposite polarity voltage conditions to the resistance-switching memory cell after changing the reversible resistance-switching memory cell to the first resistance state.

One embodiment of a storage system comprises a reversible resistance-switching memory cell and one or more managing circuits in communication with the reversible resistance-switching memory cell. The one or more managing circuits change the reversible resistance-switching memory cell to a first resistance state. The one or more managing circuits change the reversible resistance-switching memory cell from the first resistance state to a second resistance state by applying multiple pairs of opposite polarity voltage conditions to the reversible resistance-switching memory cell.

One embodiment of a method for programming a storage system comprises: (a) applying a pair of opposite polarity voltage pulses to a reversible resistance-switching memory cell in order to change the reversible resistance-switching memory cell from a first resistance state to a second resistance state; (b) verifying whether the reversible resistance-switching memory cell is in the second resistance state; and (c) repeating steps (a) and (b) if the reversible resistance-switching memory cell is not in the second resistance state.

One embodiment of a storage system comprises a reversible resistance-switching memory cell; and one or more managing circuits in communication with the reversible resistance-switching memory cell. The one or more managing circuits perform a forming operation on the reversible resistance-switching memory cell. The one or more managing circuits change the reversible resistance-switching memory cell to a first resistance state after performing the forming operation. The one or more managing circuits change the reversible resistance-switching memory cell to a second resistance state after performing the forming operation by applying one or more pairs of opposite polarity voltage pulses to the reversible resistance-switching memory cell.

For a storage system that includes a set of a first type of control lines, a set of a second type of control lines and a set of non-volatile storage elements each of which is connected to one of the first type of control lines and one of the second type of control lines, one embodiment of a method for programming comprises biasing the set of the first type of control lines to a first voltage; biasing the set of the second type of control lines to a second voltage that is lower than the first voltage; raising a selected control line of the second type of control lines to a third voltage that is higher the second voltage; lowering a selected control line of the first type of control lines to a fourth voltage that is lower than the first voltage; and quickly pulling down the selected control line of the second type of control lines to a fifth voltage that is lower than the second voltage.

One embodiment of a storage system comprises reversible resistance-switching memory cells including a selected memory cell, a set of a first type of control lines connected to the reversible resistance-switching memory cells, a set of a second type of control lines connected to the reversible resistance-switching memory cells, and one or more managing circuits in communication with the set of the first type of control lines and the set of the second type of control lines. The selected memory cell is connected to a selected control line of the first type of control lines and a selected control line of the second type of control lines. The one or more managing circuits bias the set of the first type of control lines to a first voltage. The one or more managing circuits bias the set of the second type of control lines to a second voltage that is lower than the first voltage. The one or more managing circuits raise the selected control line of the second type of control lines to a third voltage that is higher the second voltage. The one or more managing circuits lower the selected control line of the first type of control lines to a fourth voltage that is lower than the first voltage. The one or more managing circuits quickly pull down the selected control line of the second type of control lines to a fifth voltage that is lower than the second voltage.

For a storage system that includes a set of a first type of control lines, a set of a second type of control lines and a set of non-volatile storage elements each of which is connected to one of the first type of control lines and one of the second type of control lines, one embodiment of a method for programming comprises biasing the set of the first type of control lines to a first voltage; biasing the set of the second type of control lines to a second voltage that is lower than the first voltage; lowering a selected control line of the first type of control lines to a third voltage that is lower than the first voltage; raising a selected control line of the second type of control lines to a fourth voltage that is higher than the second voltage; and quickly raising the selected control line of the first type of control lines to a fifth voltage that is higher than the first voltage.

One embodiment of a storage system comprises reversible resistance-switching memory cells including a selected memory cell, a set of a first type of control lines connected to the reversible resistance-switching memory cells, a set of a second type of control lines connected to the reversible resistance-switching memory cells, and one or more managing circuits in communication with the set of the first type of control lines and the set of the second type of control lines. The selected memory cell is connected to a selected control line of the first type of control lines and a selected control line of the second type of control lines. The one or more managing circuits bias the set of the first type of control lines to a first voltage. The one or more managing circuits bias the set of the second type of control lines to a second voltage that is lower than the first voltage. The one or more managing circuits lower a selected control line of the first type of control lines to a third voltage that is lower than the first voltage. The one or more managing circuits raise a selected control line of the second type of control lines to a fourth voltage that is higher than the second voltage. The one or more managing circuits quickly raise the control line of the first type of control lines to a fifth voltage that is higher than the first voltage.

For a storage system that includes a set of a first type of control lines, a set of a second type of control lines and a set of non-volatile storage elements each of which is connected to one of the first type of control lines and one of the second type of control lines, one embodiment of a method for programming comprises biasing the set of the first type of control lines to a first voltage; biasing the set of the second type of control lines to a second voltage that is lower than the first voltage; lowering a selected control line of the first type of control lines to a third voltage that is lower than the first voltage; raising a selected control line of the second type of control line to a fourth voltage that is higher than the second voltage; and quickly lowering the selected control line of the second type of control line to a fifth voltage that is lower than the fourth voltage and synchronously quickly raising the selected control line of the first type of control lines to a sixth voltage that is higher than the fifth voltage.

One embodiment of a storage system comprises reversible resistance-switching memory cells including a selected memory cell, a set of a first type of control lines connected to the reversible resistance-switching memory cells, a set of a second type of control lines connected to the reversible resistance-switching memory cells, and one or more managing circuits in communication with the set of the first type of control lines and the set of the second type of control lines. The selected memory cell is connected to a selected control line of the first type of control lines and a selected control line of the second type of control lines. The one or more managing circuits bias the set of the first type of lines to a first voltage. The one or more managing circuits bias the set of the second type of lines to a second voltage that is lower than the first voltage. The one or more managing circuits lower the selected control line of the first type of control lines to a third voltage that is lower than the first voltage. The one or more managing circuits raise the selected control line of the second type of control line to a fourth voltage that is higher than the second voltage. The one or more managing circuits quickly lower the selected control line of the second type of control line to a fifth voltage that is lower than the fourth voltage and synchronously quickly raise the selected control line of the first type of control lines to a sixth voltage that is higher than the fifth voltage.

The foregoing detailed description has been presented for purposes of illustration and description. It is not intended to be exhaustive or be limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for programming a storage system, comprising:
    changing a reversible resistance-switching memory cell to a first resistance state; and
    after changing the reversible resistance-switching memory cell to the first resistance state, changing the reversible resistance-switching memory cell from the first resistance state to a second resistance state by applying one or more pairs of opposite polarity voltage conditions to the reversible resistance-switching memory cell, the applying one or more pairs of opposite polarity voltage conditions includes adjusting a first transient applied to a word line connected to the reversible resistance-switching memory cell based on a location of the reversible resistance-switching memory cell along a bit line connected to the reversible resistance-switching memory cell.

2. The method of claim 1, wherein:
the one or more pairs of opposite polarity voltage conditions comprise a first voltage condition that operates the reversible resistance-switching memory cell in a first polarity bias mode followed by a second voltage condition that operates the reversible resistance-switching memory cell in a second polarity bias mode, the adjusting a first transient includes adjusting the first transient applied to the word line based on address information corresponding with the location of the reversible resistance-switching memory cell along the bit line, the first transient applied to the word line comprises a rising edge voltage transition.

3. The method of claim 2, wherein:
the second voltage condition is a negative voltage pulse with respect to the resistance-switching memory cell; and
the first voltage condition is a positive voltage pulse with respect to the reversible resistance-switching memory cell that immediately transitions into the negative voltage pulse.

4. The method of claim 2, wherein:
the resistance-switching memory cell comprises a steering device connected to resistance-switching material; and
the changing of the reversible resistance-switching memory cell from the first resistance state to the second resistance state comprises applying a first voltage pulse in forward direction with respect to the steering device to charge the steering device and applying a second voltage pulse to reverse bias the steering device such that current flows in the steering device in response to the second voltage pulse without operating the steering device in breakdown condition.

5. The method of claim 1, wherein:
the changing of the reversible resistance-switching memory cell from the first resistance state to a second resistance state comprises applying multiple pairs of opposite polarity voltage pulses to the non-volatile storage element.

6. The method of claim 5, wherein:
the changing of the reversible resistance-switching memory cell from the first resistance state to the second resistance state further comprises verifying whether the reversible resistance-switching memory cell is in the second resistance state between applying pairs of opposite polarity voltage pulses to the resistance-switching memory cell.

7. The method of claim 1, further comprising:
forming the reversible resistance-switching memory cell prior to the changing of the reversible resistance-switching memory cell to the first resistance state and prior to the changing of the reversible resistance-switching memory cell from the first resistance state to the second resistance state.

8. The method of claim 1, wherein:
the reversible resistance-switching memory cell includes a steering device and reversible resistance-switching material.

9. The method of claim 1, wherein:
the reversible resistance-switching memory cell is non-volatile.

10. The method of claim 1, wherein:
the reversible resistance-switching memory cell includes a diode and reversible resistance-switching material; and
the one or more pairs of opposite polarity voltage conditions comprise a first voltage condition that operates the diode in a forward bias mode followed by a second voltage condition that operates the diode in a reverse bias mode with a current flowing in the diode without the diode being in a breakdown condition.

11. The method of claim 1, further comprising:
reading data from the reversible resistance-switching memory cell; and
reporting the data.

12. A storage system, comprising:
a reversible resistance-switching memory cell; and
one or more managing circuits in communication with the reversible resistance-switching memory cell, the one or more managing circuits change the reversible resistance-switching memory cell to a first resistance state, the one or more managing circuits change the reversible resistance-switching memory cell from the first resistance state to a second resistance state by applying multiple pairs of opposite polarity voltage conditions to the reversible resistance-switching memory cell, the applying multiple pairs of opposite polarity voltage conditions includes adjusting a first transient applied to a word line connected to the reversible resistance-switching memory cell based on a location of the reversible resistance-switching memory cell along a bit line connected to the reversible resistance-switching memory cell.

13. The storage system of claim 12, wherein:
each pair of the multiple pairs of opposite polarity voltage conditions comprises a first voltage condition that operates the resistance-switching memory cell in a first polarity mode followed by a second voltage condition that operates the resistance-switching memory cell in a second polarity mode, the adjusting a first transient includes adjusting the first transient applied to the word line based on address information corresponding with the location of the reversible resistance-switching memory cell along the bit line, the first transient applied to the word line comprises a rising edge voltage transition, the applying multiple pairs of opposite polarity voltage conditions includes applying a falling edge voltage transition to the bit line prior to applying the rising edge voltage transition to the word line.

14. The storage system of claim 13, wherein:
the second voltage condition is a negative voltage pulse with respect to the resistance-switching memory cell; and
the first voltage is a positive voltage condition with respect to the resistance-switching memory cell that immediately transitions into the negative voltage pulse.

15. The storage system of claim 13, wherein:
the resistance-switching memory cell comprises a steering device connected to resistance-switching material; and
the one or more managing circuits change the reversible resistance-switching memory cell from the first resistance state to the second resistance state by applying a first voltage pulse to charge the steering device in forward direction with respect to the steering device and applying a second voltage pulse to reverse bias the steering device such that current flows in the steering device in response to the second voltage pulse.

16. The storage system of claim 12, wherein:
the one or more managing circuits verify whether the reversible resistance-switching memory cell is in the second resistance state between applying pairs of opposite polarity voltage pulses to the resistance-switching memory cell.

17. The storage system of claim 12, wherein:
the one or more managing circuits perform a forming operation for the resistance-switching memory cell prior to changing the reversible resistance-switching memory cell to the first resistance state and prior to changing the reversible resistance-switching memory cell from the first resistance state to the second resistance state.

18. The storage system of claim 12, wherein:
the reversible resistance-switching memory cell includes a steering device and reversible resistance-switching material; and
each pair of the multiple pairs of opposite polarity voltage conditions comprises a first voltage condition that operates the steering device in a forward bias mode followed by a second voltage condition that operates the steering device in a reverse bias mode.

19. The storage system of claim 18, wherein:
the reversible resistance-switching material comprises metal oxide; and
the steering device is a diode.

20. The storage system of claim 18, wherein:
the steering device is a diode.

21. The storage system of claim 12, wherein:
the reversible resistance-switching memory cell is non-volatile.

22. The storage system of claim 12, wherein:
the reversible resistance-switching memory cell is part of a monolithic three dimensional memory array.

23. A method for programming a storage system, comprising:
(a) applying a pair of opposite polarity voltage pulses to a reversible resistance-switching memory cell in order to change the reversible resistance-switching memory cell from a first resistance state to a second resistance state, the applying a pair of opposite polarity voltage pulses includes adjusting a first transient applied to a word line connected to the reversible resistance-switching memory cell based on a location of the reversible resistance-switching memory cell along a bit line connected to the reversible resistance-switching memory cell;
(b) verifying whether the reversible resistance-switching memory cell is in the second resistance state; and
(c) repeating steps (a) and (b) if the reversible resistance-switching memory cell is not in the second resistance state.

24. The method of claim 23, wherein:
the resistance-switching memory cell comprises a steering device connected to resistance-switching material;
the pair of opposite polarity voltage pulses comprises a first voltage pulse and a second voltage pulse, the adjusting a first transient includes adjusting the first transient applied to the word line based on address information corresponding with the location of the reversible resistance-switching memory cell along the bit line, the first transient applied to the word line comprises a rising edge voltage transition; and
the changing the reversible resistance-switching memory cell from the first resistance state to the second resistance state comprises applying the first voltage pulse to charge the steering device in forward bias and applying the second voltage pulse to reverse bias the steering device such that current flows in the steering device in response to the second voltage pulse.

25. The method of claim 24, wherein:
the first voltage pulse immediately transitions into the voltage second pulse.

26. The method of claim 23, wherein:
the reversible resistance-switching memory cell is non-volatile;
the resistance-switching memory cell comprises a diode connected in series to resistance-switching material;
the pair of opposite polarity voltage pulses comprises a first voltage pulse and a second voltage pulse; and
the changing the reversible resistance-switching memory cell from the first resistance state to the second resistance state comprises applying the first voltage pulse to charge the diode in forward bias and applying the second voltage pulse to reverse bias the diode such that current flows in the diode in response to the second voltage pulse without the diode being in breakdown mode.

27. A storage system, comprising:
a reversible resistance-switching memory cell; and
one or more managing circuits in communication with the reversible resistance-switching memory cell, the one or more managing circuits perform a forming operation on the reversible resistance-switching memory cell, the one or more managing circuits change the reversible resistance-switching memory cell to a first resistance state after performing the forming operation, the one or more managing circuits change the reversible resistance-switching memory cell to a second resistance state after performing the forming operation by applying one or more pairs of opposite polarity voltage pulses to the reversible resistance-switching memory cell, the applying one or more pairs of opposite polarity voltage pulses includes adjusting a first transient applied to a word line connected to the reversible resistance-switching memory cell based on a location of the reversible resistance-switching memory cell along a bit line connected to the reversible resistance-switching memory cell.

28. The storage system of claim 27, wherein:
the reversible resistance-switching memory cell includes a diode in series with reversible resistance-switching material, the adjusting a first transient includes adjusting the first transient applied to the word line based on address information corresponding with the location of the reversible resistance-switching memory cell along the bit line, the first transient applied to the word line comprises a rising edge voltage transition; and
the reversible resistance-switching memory cell is non-volatile.

29. The storage system of claim 28, wherein:
each pair of the one or more pairs of opposite polarity voltage pulses comprises a first voltage pulse that operates the diode in a forward bias mode followed by a second voltage pulse that operates the diode in a reverse bias mode.

30. The storage system of claim 29, wherein:
the first voltage pulse is a positive voltage pulse immediately transitions into the second voltage pulse.

* * * * *